United States Patent
Lin

(10) Patent No.: US 8,344,930 B2
(45) Date of Patent: Jan. 1, 2013

(54) SUCCESSIVE APPROXIMATION REGISTER ANALOG-TO-DIGITAL CONVERTER

(75) Inventor: Jin-Fu Lin, Tainan (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 134 days.

(21) Appl. No.: 13/101,127

(22) Filed: May 4, 2011

(65) Prior Publication Data
US 2012/0280846 A1    Nov. 8, 2012

(51) Int. Cl.
*H03M 1/12*   (2006.01)
(52) U.S. Cl. .......................................... 341/172; 341/155
(58) Field of Classification Search .................. 341/155, 341/172, 161, 163, 118
See application file for complete search history.

(56) References Cited

U.S. PATENT DOCUMENTS

| | | | | |
|---|---|---|---|---|
| 5,684,487 A * | 11/1997 | Timko | | 341/172 |
| 6,400,302 B1 * | 6/2002 | Amazeen et al. | | 341/172 |
| 6,686,865 B2 * | 2/2004 | Confalonieri et al. | | 341/172 |
| 6,956,520 B2 * | 10/2005 | Leung et al. | | 341/172 |
| 7,015,845 B2 * | 3/2006 | Pugel | | 341/144 |
| 7,026,975 B1 * | 4/2006 | Steward et al. | | 341/161 |
| 7,199,745 B2 * | 4/2007 | Tachibana et al. | | 341/163 |
| 7,432,844 B2 * | 10/2008 | Mueck et al. | | 341/163 |
| 2010/0207791 A1 * | 8/2010 | Ohnhaeuser et al. | | 341/118 |
| 2010/0259432 A1 * | 10/2010 | Ishikawa | | 341/144 |

* cited by examiner

*Primary Examiner* — Jean B Jeanglaude
(74) *Attorney, Agent, or Firm* — Winston Hsu; Scott Margo

(57) ABSTRACT

A successive approximation register (SAR) analog-to-digital converter (ADC) includes a first capacitor array, a first input capacitor, a first switch module, a second capacitor array, a second input capacitor, a second switch module, a comparator and a SAR controller. The SAR ADC is operated under sampling phases and amplifying phases many times to perform amplifying operations and ADC operations upon input signals to generate digital output data. In addition, because the SAR ADC has both an amplification function and an ADC function, a circuit utilizing the SAR ADC does not require an additional active PGA, and a power consumption of the circuit is decreased.

11 Claims, 8 Drawing Sheets

US 8,344,930 B2

SUCCESSIVE APPROXIMATION REGISTER ANALOG-TO-DIGITAL CONVERTER

BACKGROUND OF THE INVENTION

1. Field of the Invention

The present invention relates to a successive approximation register (SAR) analog-to-digital converter (ADC), and more particularly, to a SAR ADC having amplification functions.

2. Description of the Prior Art

Please refer to FIG. 1. FIG. 1 is a diagram illustrating a conventional circuit 100 for image processing. As shown in FIG. 1, the circuit 100 includes two buffers 102 and 104, a programmable gain amplifier (PGA) 100, an analog-to-digital converter (ADC) 120 and a digital signal processor (DSP) 130. In the operations of the circuit 100, the PGA 110 receives the buffered input signals $V_p$ and $V_n$ to generate amplified input signals, and the ADC 120 performs an analog-to-digital conversion upon the amplified input signals to generate digital input signals to the DSP 130, where a gain of the PGA 110 is controlled by the DSP 130.

The PGA 110 within the circuit 100 is usually implemented by a switched capacitor amplifier or a continuous-time amplifier. However, because designs of these amplifiers require higher accuracy and operations of these amplifiers require great power, the total cost of the circuit 100 is increased.

SUMMARY OF THE INVENTION

It is therefore an objective of the present invention to provide a successive approximation register (SAR) analog-to-digital converter (ADC), which has an inherent passive PGA function. Therefore, a dedicated PGA is not required to solve the above-mentioned problems.

According to one embodiment of the present invention, a SAR ADC comprises a first capacitor array, a first input capacitor, a first switch module, a second capacitor array, a second input capacitor, a second switch module, a comparator and a SAR controller. The first capacitor array comprises a plurality of first switched capacitors therein with varying weights, where each of the first switched capacitors has one node selectively connected to a first signal or a first default voltage, and has another node connected to a first common node. The first input capacitor is coupled between the first common node and a first output node. The first switch module is arranged for selectively coupling the first common node to a common voltage and selectively coupling the first output node to a second signal. The second capacitor array comprising a plurality of second switched capacitors therein with varying weights, where each of the second switched capacitors has one node selectively connected to the second signal or a second default voltage, and has another node connected to a second common node. The second input capacitor is coupled between the second common node and a second output node. The second switch module is arranged for selectively coupling the second common node to the common voltage and selectively coupling the second output node to the first signal. The comparator is coupled to the first input capacitor and the second input capacitor, and is utilized for comparing voltages at the first output node and the second output node to generate a comparing result. The SAR controller is coupled to the comparator, and is utilized for controlling the first capacitor array and the second capacitor array according to the comparing result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
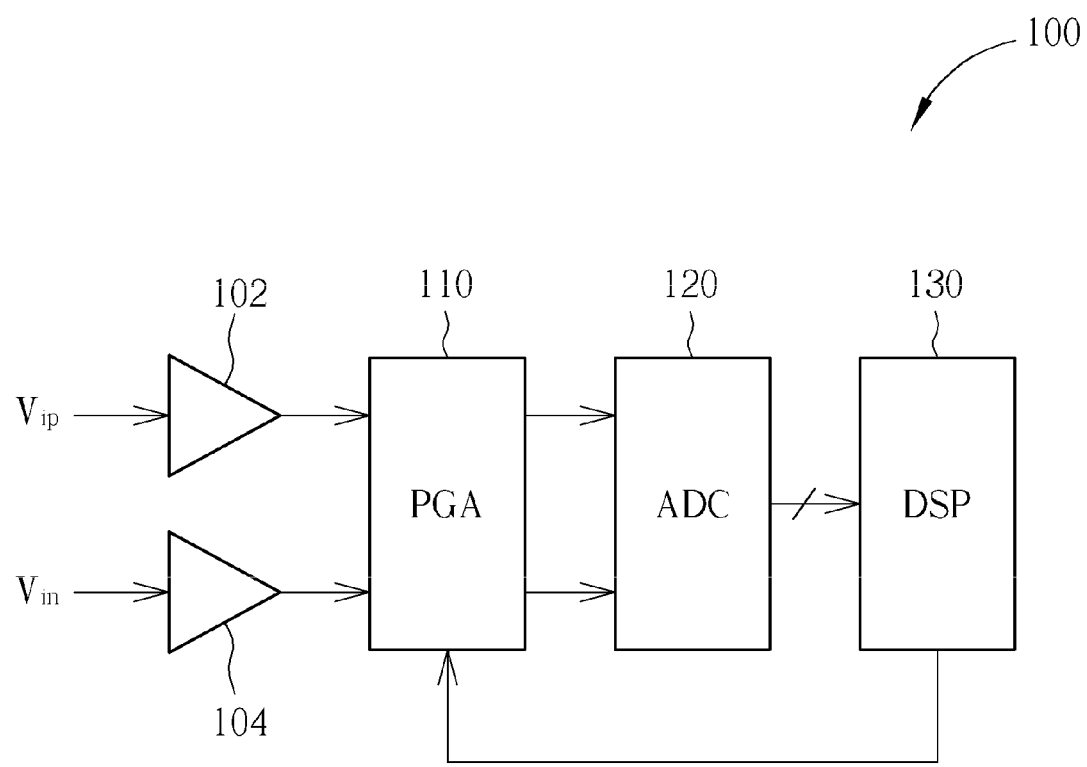
FIG. 1 is a diagram illustrating a conventional circuit for image processing
Figure 2:
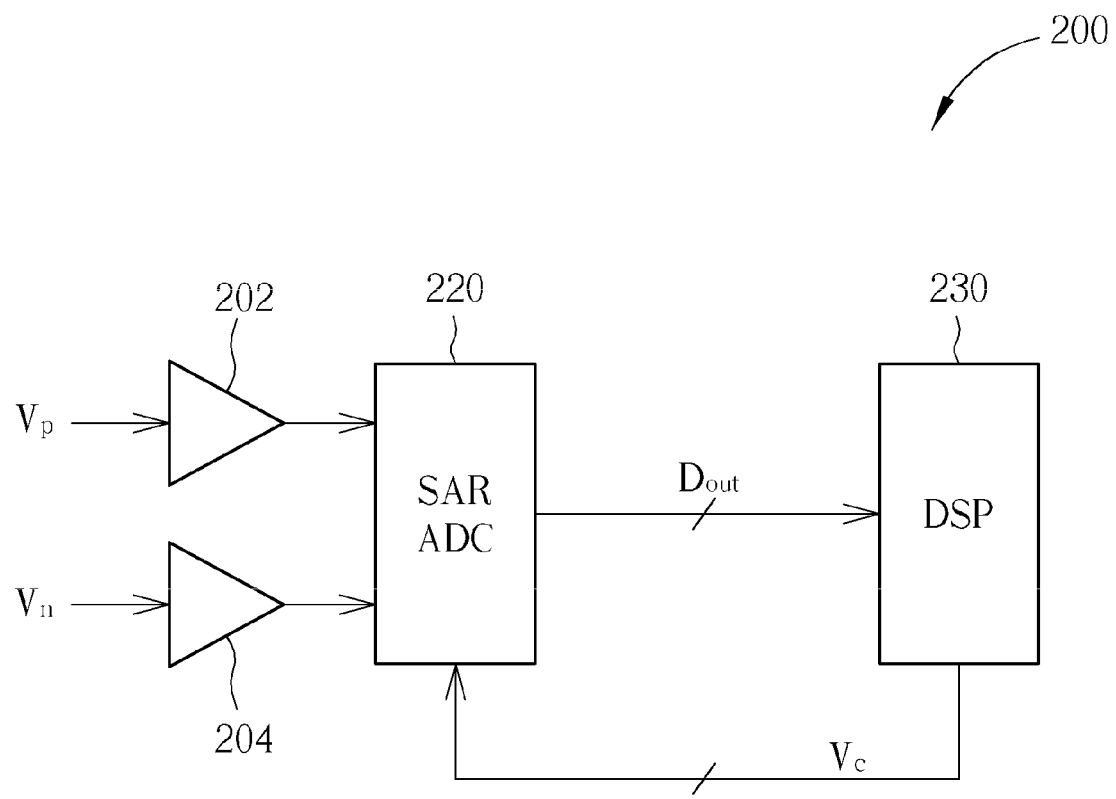
FIG. 2 is a diagram illustrating a circuit for image processing according to one embodiment of the present invention.

Please refer to FIG. 2. FIG. 2 is a diagram illustrating a circuit 200 for image processing according to one embodiment of the present invention. Referring to FIG. 2, the circuit 200 includes two buffers 202 and 204, a successive approximation register (SAR) analog-to-digital converter (ADC) 220 and a DSP 230. In the operations of the circuit 200, the SAR ADC 220 receives the buffered input signals $V_p$ and $V_n$, and performs analog-to-digital conversion and amplifying operations upon the buffered input signals $V_p$ and $V_n$ to generate output data $D_{out}$. Finally, the DSP 230 performs image processing upon the output data $D_{out}$ and generates control signals $V_c$ to control the operations of the SAR ADC 220. In more detail, the control signals $V_c$ from DSP 230 controls a gain of the SAR ADC 220.

Figure 3A:
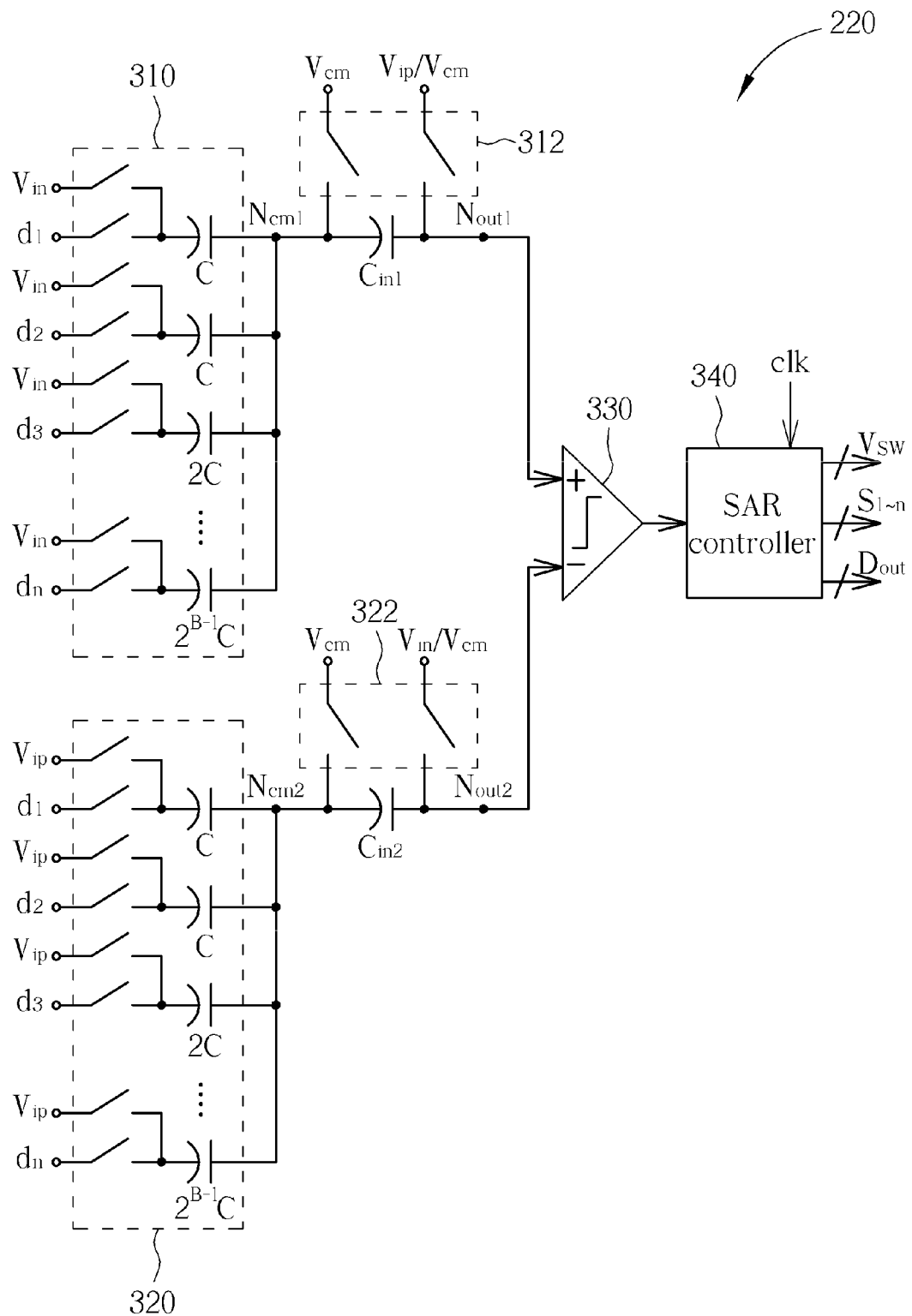
FIG. 3A is a diagram illustrating the SAR ADC shown in FIG. 2 according to one embodiment of the present invention.

FIG. 3A is a diagram illustrating the B-bit SAR ADC 220 according to one embodiment of the present invention. Referring to FIG. 3A, the SAR ADC 220 includes a first capacitor array 310, a second capacitor array 320, a first input capacitor $C_{in1}$, a second input capacitor $C_{in2}$, a first switch module 312, a second switch module 322, a comparator 330 and a SAR controller 340, where the SAR controller 340 is operated according to a clock signal clk. The first capacitor array 310 comprises a plurality of switched capacitors with varying binary weights, and each of the switched capacitors has one node selectively connected to a signal $V_{in}$ or a default voltage $d_1$-$d_n$, and has another node connected to a first common node $N_{cm1}$. The first input capacitor $C_{in1}$ is coupled between the first common node $N_{cm1}$ and a first output node $N_{out1}$. The first switch module 312 is selectively coupling the first common node $N_{cm1}$ to a common voltage $V_{cm}$ and selectively coupling the first output node $N_{out1}$ to a signal $V_{ip}$ or the common voltage $V_{cm}$. The second capacitor array 320 comprises a plurality of switched capacitors with varying binary weights, and each of the switched capacitors has one node selectively connected to the signal $V_{ip}$ or the default voltage $d_1$-$d_n$, and has another node connected to a second common node $N_{cm2}$. The second input capacitor $C_{in2}$ is coupled between the second common node $N_{cm2}$ and a second output node $N_{out2}$. The second switch module 322 is selectively coupling the second common node $N_{cm2}$ to the common voltage $V_{cm}$ and selectively coupling the second output node $N_{out2}$ to the signal $V_{in}$ or the common voltage $V_{cm}$.

Figure 3B:
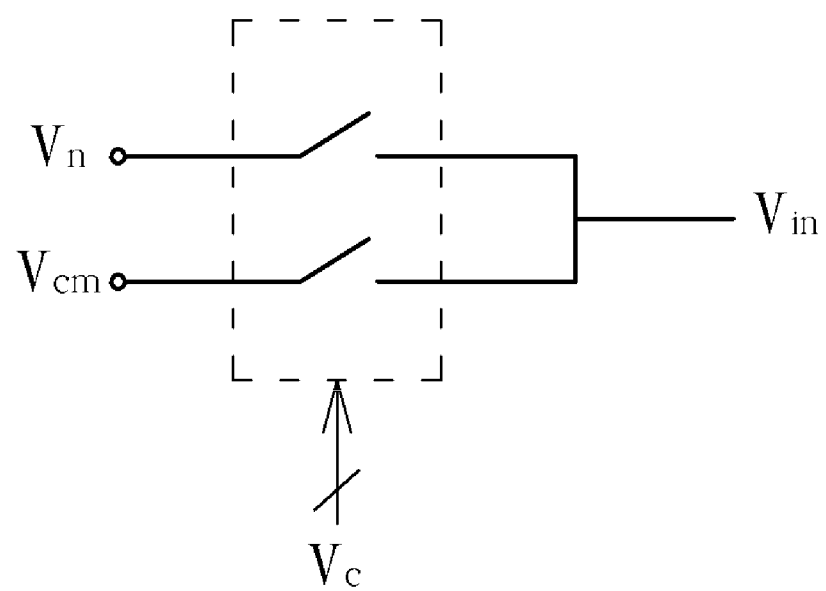
FIG. 3B is a diagram illustrating the signal $V_{in}$ is selected from the signal $V_{in}$ and the common voltage, and the signal $V_{ip}$ is selected from the signal $V_{ip}$ and the common voltage.
Figure 3B:
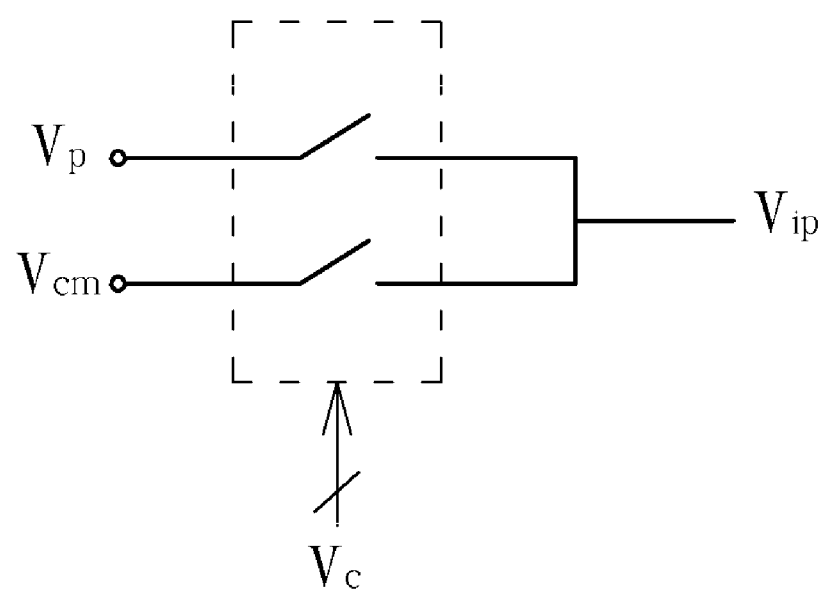
Figure 3C:
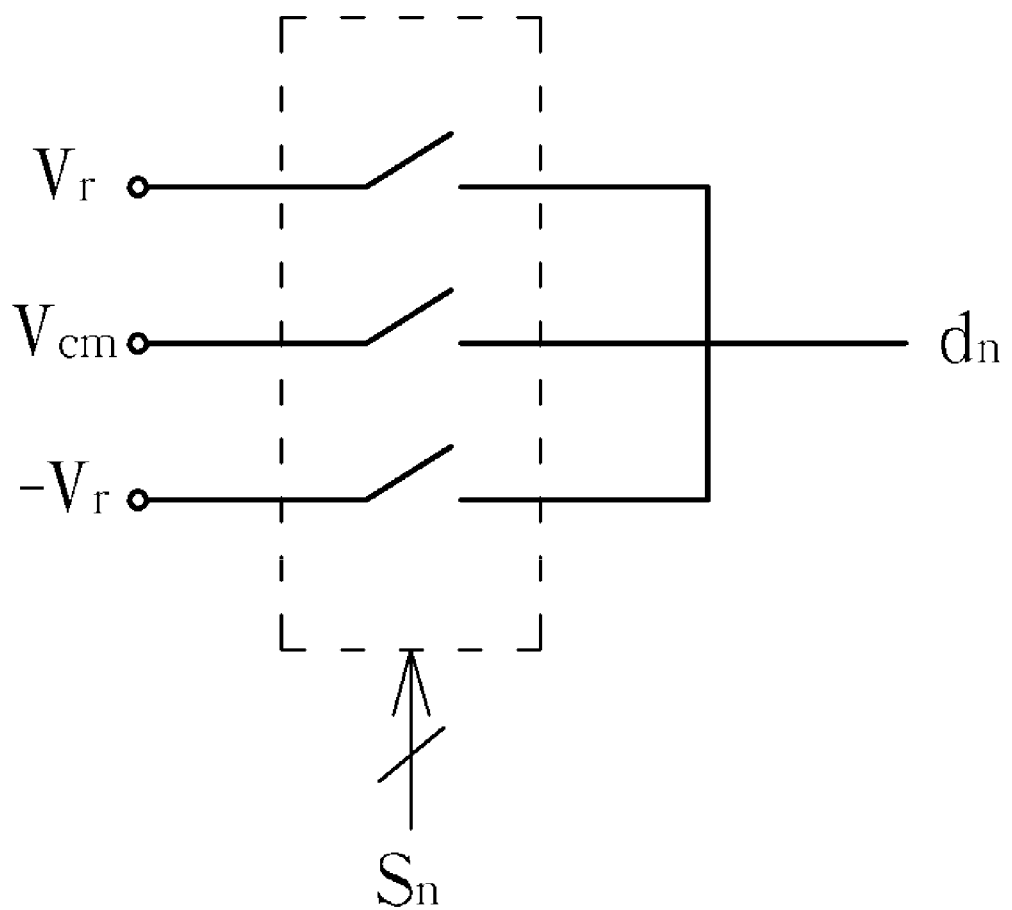
FIG. 3C is a diagram illustrating the default voltage is selected from $V_r$, $V_{cm}$ and $-V_r$.

In this embodiment, the input signals $V_n$ and $V_p$ are a different input signal having the common voltage $V_{cm}$, each of the signals $V_{in}$ shown in FIG. 3A is selected from the input signal $V_n$ or the common voltage $V_{cm}$ by the control signals $V_c$, each of the signals $V_{ip}$ shown in FIG. 3A is selected from the input signal $V_p$ or the common voltage $V_{cm}$ by the control signals $V_c$ as shown in FIG. 3B. In addition, referring to FIG. 3C, each of the default voltages $d_1$-$d_n$ is selected from voltages $-V_r$, $V_{cm}$ and $V_r$, where $V_r$ is a predetermined voltage.

In addition, switches in the first capacitor array 310, the second capacitor array 320, the first switch module 312 and the second switch module 322 are controlled by switch signals $V_{sw}$ outputted from the SAR controller 340.

Figure 3D:
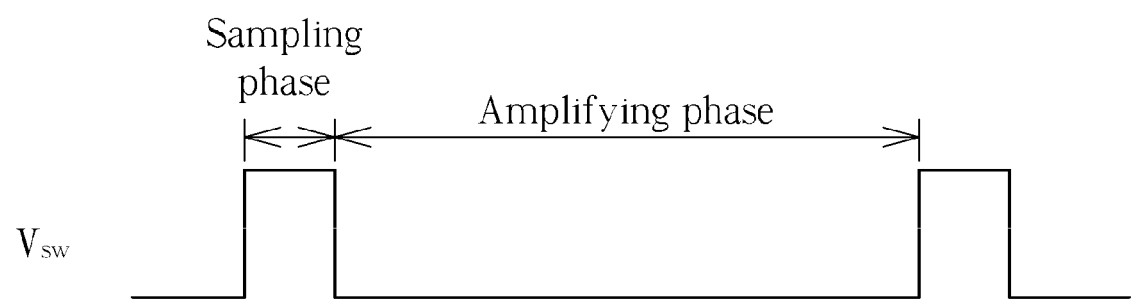
FIG. 3D is a diagram illustrating the sampling phase and the amplifying phase.

In the operations of the SAR ADC 220, the SAR ADC 220 is operated under sampling phases and amplifying phases many times to perform the analog-to-digital conversion upon the input signals $V_n$ and $V_p$ to generate output data $D_{out}$. For example, when the SAR ADC 220 begins to perform the analog-to-digital conversion upon the input signals $V_n$ and $V_p$, the SAR ADC 220 is operated under the sampling phase as shown in FIG. 3D, the switch signals $V_{sw}$ is in a sampling phase to make all the switched capacitors of the first capacitor array 310 be connected to the signal $V_{in}$, all the switched capacitors of the second capacitor array 320 be connected to the signal $V_{ip}$, the first common node $N_{cm1}$ and the second common node $N_{cm2}$ be connected to the common voltage $V_{cm}$, the first output node $N_{out1}$ be connected to the signal $V_{ip}$ or the common voltage $V_{cm}$, and the second output node $N_{out2}$ be connected to the signal $V_{in}$ or the common voltage $V_{cm}$ (i.e., the switches within the first switch module 312 and the second switch module 322 are switched on).

In addition, in this embodiment, if the designer (or a control unit such as DSP) determines the SAR ADC 220 having the gain ranging from $(1+\frac{1}{2}^B)$ to 2, the first output node $N_{out1}$ is connected to the signal $V_{ip}$ and the second output node $N_{out2}$ is connected to the signal $V_{in}$ when the SAR ADC 220 is operated under the sampling phase. On the other hand, if the designer determines the SAR ADC 220 having the gain ranging from $(\frac{1}{2}^B)$ to 1, the first output node $N_{out1}$ is connected to the common voltage $V_{cm}$ and the second output node $N_{out2}$ is connected to the common voltage $V_{cm}$ when the SAR ADC 220 is operated under the sampling phase.

For obtaining the required gain of the SAR ADC 220, the control signals $V_c$ can be used to control the sources of the input signals $V_{in}$ and $V_{ip}$ respectively corresponding to the switched capacitors within the first capacitor array 310 and the second capacity array 320. For example, if the designer determines the SAR ADC 220 having the gain equal to "2", all the switched capacitors within the first capacitor array 310 are connected to signal $V_{in}$ the same as the input signal $V_n$ (i.e., the switch corresponding to the input signal $V_n$ shown in FIG. 3B is switched on), and all the switched capacitors within the second capacitor array 320 are connected to signal $V_{ip}$ the same as the input signal $V_p$ (i.e., the switch corresponding to the input signal $V_p$ shown in FIG. 3B is switched on) when the SAR ADC 220 is operated under the sampling phase. In addition, if the designer determines the SAR ADC 220 having the gain equal to $(1+\frac{1}{2}^B)$, the first switched capacitor (i.e., the capacitor having capacitance "C") within the first capacitor array 310 is connected to signal $V_{in}$ the same as the input signal $V_n$, the other switched capacitors within the first capacitor array 310 are connected to signal $V_{in}$ having the voltage level equal to the common voltage $V_{cm}$ (i.e., the switch corresponding to the common voltage $V_{cm}$ shown in FIG. 3B is switched on), the first switched capacitor (i.e., the capacitor having capacitance "C") within the second capacitor array 320 is connected to signal $V_{ip}$ the same as the input signal $V_p$, the other switched capacitors within the second capacitor array 320 are connected to signal $V_{ip}$ having the voltage level equal to the common voltage $V_{cm}$ (i.e., the switch corresponding to the common voltage $V_{cm}$ shown in FIG. 3B is switched on). The gain of the SAR ADC 220 can be adjusted between 2 and $\frac{1}{2}^B$ according to the control signals $V_c$ which may be generated from DSP by analyzing the output signal $D_{out}$ of the SAR ADC 220.

In light of above, the gain of the SAR ADC 220 can be adjusted by changing the voltage sources ($V_n/V_p$ or $V_{cm}$) each of the switched capacitors within the first capacitor array 310 and the second capacitor array 320 is connected to. In the SAR ADC 220 shown in FIG. 3A, the gain ranges from ($\frac{1}{2}^B$) to 2.

Figure 4:
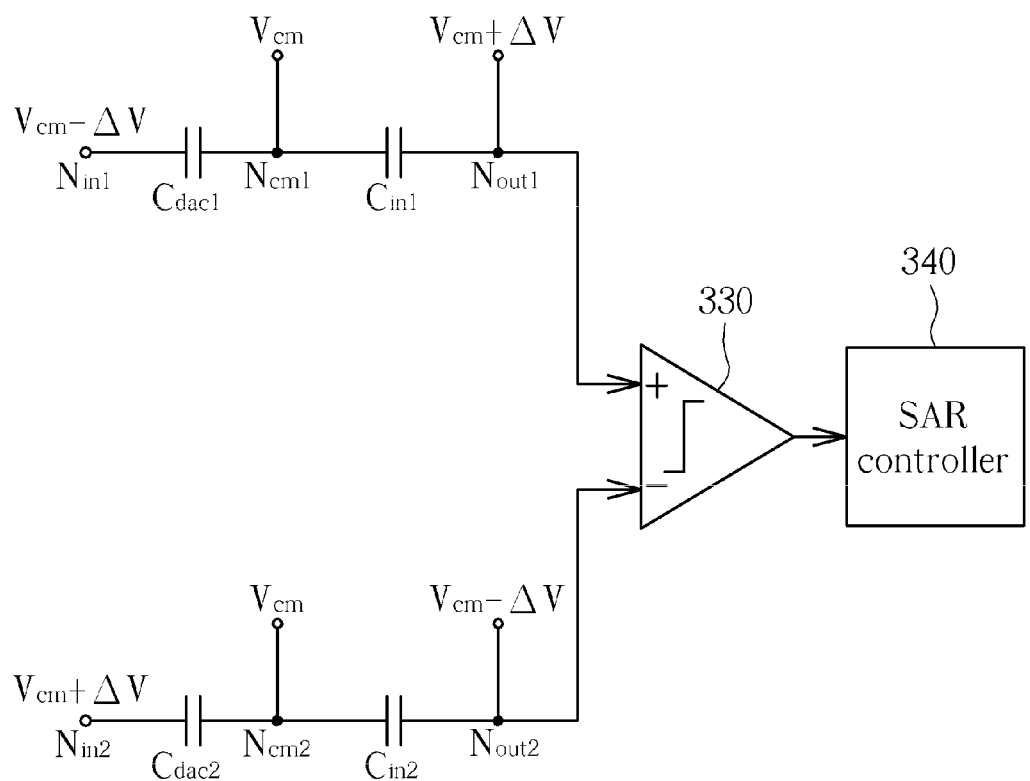
FIG. 4 is an equivalent circuit of the SAR ADC shown in FIG. 2 when the SAR ADC is operated under a sampling phase.

When the SAR ADC 220 is operated under the sampling phase, taking the gain of the SAR ADC 220 is equal to "2" and $V_{in}=V_n=V_{cm}-\Delta V$ and $V_{ip}=V_p=V_{cm}+\Delta V$ as an example, the equivalent circuits of the SAR ADC 220 are shown in FIG. 4, where $C_{dac1}$ is an equivalent capacitor of the first capacitor array 310, $N_{in1}$ is one node of $C_{dac1}$, $C_{dac2}$ is an equivalent capacitor of the second capacitor array 320, and $N_{in2}$ is one node of $C_{dac2}$. In FIG. 4, the voltage level at the first output node $N_{out1}$ is ($V_{cm}+\Delta V$), and the voltage level at the second output node $N_{out1}$ is ($V_{cm}-\Delta V$).

After the SAR ADC 220 is operated under the sampling phase, the SAR ADC is immediately operated under an amplifying phase. When the SAR ADC 220 is operated under the amplifying phase, each of the switched capacitors of the first capacitor array 310 is connected to its corresponding default voltage $d_1$-$d_n$, each of the switched capacitors of the second capacitor array 320 is connected to its corresponding default voltage $d_1$-$d_n$ (in this embodiment, the switched capacitors of the first capacitor array 310 and the second capacitor array 320 are connected to common voltage $V_{cm}$, that is, each of the default voltages $d_1$-$d_n$ is $V_{cm}$), the first common node $N_{cm1}$ and the second common node $N_{cm2}$ are not connected to the common voltage $V_{cm}$, the first output node $N_{out1}$ is not connected to the signal $V_{ip}$, and the second output node $N_{out2}$ is not connected to the signal $V_{in}$ (i.e., the switches within the first switch module 312 and the second switch module 322 are switched off).

Figure 5:
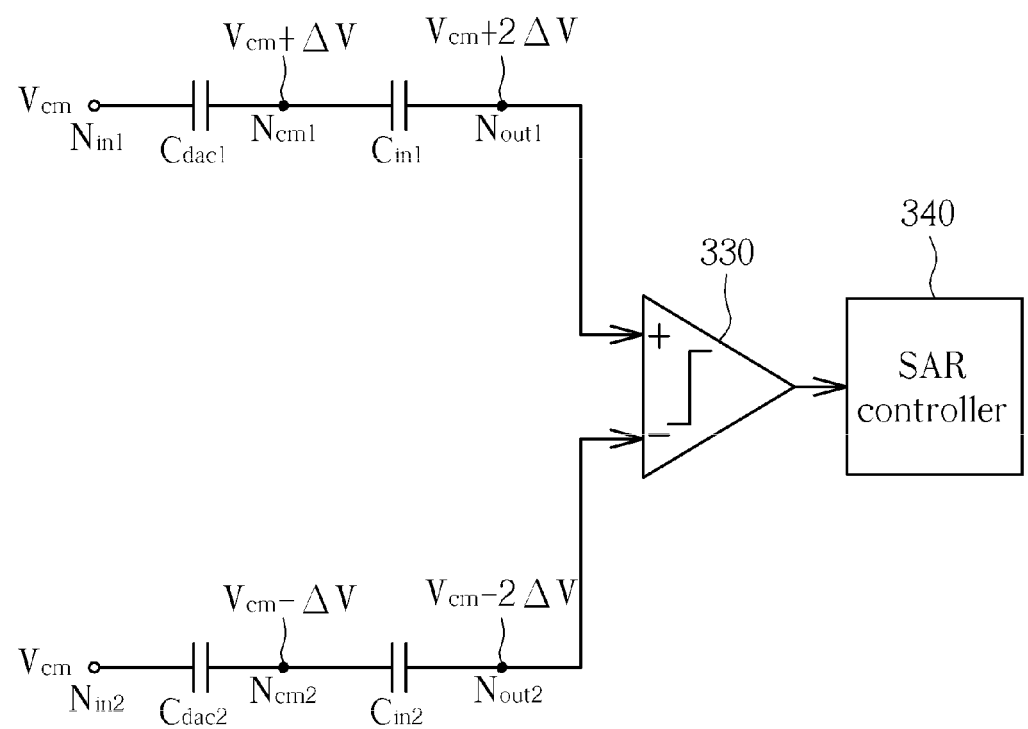
FIG. 5 is an equivalent circuit of the SAR ADC shown in FIG. 2 when the SAR ADC is operated under an amplifying phase.

When the SAR ADC 220 is operated under the amplifying phase, the equivalent circuits of the SAR ADC 220 are shown in FIG. 5. Referring to FIG. 4 and FIG. 5 together, because the voltage level at the node $N_{in1}$ is pulled up to the common voltage $V_{cm}$, the voltage level at the first common node $N_{cm1}$ is pulled up to ($V_{cm}+\Delta V$), and the voltage level at the first output node $N_{out1}$ is pulled up to ($V_{cm}+2\Delta V$); on the other hand, because the voltage level at the node $N_{in2}$ is pulled down to the common voltage $V_{cm}$, the voltage level at the second common node $N_{cm2}$ is pulled to ($V_{cm}-\Delta V$), and the voltage level at the second output node $N_{out2}$ is pulled to ($V_{cm}-2\Delta V$).

In light pf above, assuming that the common voltage $V_{cm}$ is 0V, magnitudes of the sampled input signals are doubled at the first output node $N_{out1}$ and the second output node $N_{out2}$. That is, the SAR ADC 220 amplifies the input signals $V_n$ and $V_p$.

Then, the comparator 330 compares voltages at the first output node $N_{out1}$ and the second output node $N_{out2}$ to generate a comparing result, and the SAR controller 340 determines a plurality of comparator value $S_1 \sim S_n$ to control the first capacitor array 310 and the second capacitor array 320 according to the comparing result.

In the detailed operations of the SAR ADC 220 when operated under the amplifying phase, taking the first capacitor array 310 as an example, first, the switched capacitors are connected to the default voltages $d_1$-$d_n$, respectively, where the default voltages $d_1$-$d_n$ are equal to the common voltage $V_{cm}$ at this time. Then, the SAR controller 340 determines a first comparator value $S_n$ to adjust the default voltage dn to $V_r$ or $-V_r$; then, the SAR controller 340 determines a second comparator value $S_{(n-1)}$ to adjust the default voltage $d_{(n-1)}$ to $V_r$ or $-V_r$ . . . ; and finally, the SAR controller 340 determines a $n^{th}$ comparator value $S_1$ to adjust the default voltage $d_1$ to $V_r$ or $-V_r$, where $S_n$ is the most significant bit (MSB) corresponds to the output signal $D_{out}$, $S_{(n-1)}$=MSB-1, and $S_1$ is the least significant bit (LSB) corresponds to the output signal $D_{out}$. Then, after the default voltages $d_1 \sim d_n$ are adjusted, the SAR ADC 220 can output signal $D_{out}$. In addition, the default voltages $d_1$-$d_n$ for the first capacitor array 310 are respectively opposite to the default voltages $d_1$-$d_n$ for the second capacitor array 320. For example, the default voltage $d_1$ for the second capacitor array 320 is $V_r$, if the default voltage $d_1$ for the first capacitor array 310 is $-V_r$. It is noted that the SAR controller 340 controls the first capacitor array 310 and the second capacitor array 320 according to the comparing result only when the SAR ADC 220 is operated under the amplifying phase. That is, the comparator 330 is reset or turned off when the SAR ADC 220 is operated under the sampling phase.

In addition, the SAR ADC 220 is not limited to be used in the circuit 200 for image processing, and can be used in any circuit requiring ADC.

In light of above, because the SAR ADC 220 has both the amplification function and the ADC function, and the amplification function of SAR ADC 220 can be regarded as a passive PGA, the power consumption of the circuit 200 is much less than the conventional circuit 100 having the active PGA 100.

Briefly summarized, in the SAR ADC of the present invention, the SAR ADC comprises a first capacitor array, a first input capacitor, a first switch module, a second capacitor array, a second input capacitor, a second switch module, a comparator and a SAR controller. The SAR ADC is operated under sampling phases and amplifying phases many times to perform amplifying operations and ADC operations upon input signals to generate digital output data. In addition, because the SAR ADC has both the amplification function and the ADC function, a circuit using the SAR ADC does not require an additional active PGA, and the power consumption of the circuit using the SAR ADC is decreased.

Those skilled in the art will readily observe that numerous modifications and alterations of the device and method may be made while retaining the teachings of the invention.

What is claimed is:

1. A successive approximation register (SAR) analog-to-digital converter (ADC), comprising:
    a first capacitor array comprising a plurality of first switched capacitors therein with varying weights, wherein each of the first switched capacitors has one node selectively connected to a first signal or a first default voltage, and has another node connected to a first common node;
    a first input capacitor, coupled between the first common node and a first output node;
    a first switch module, arranged for selectively coupling the first common node to a common voltage and selectively coupling the first output node to a second signal;
    a second capacitor array comprising a plurality of second switched capacitors therein with varying weights, wherein each of the second switched capacitors has one node selectively connected to a second signal or a second default voltage, and has another node connected to a second common node;
    a second input capacitor, coupled between the second common node and a second output node;
    a second switch module, arranged for selectively coupling the second common node to the common voltage and selectively coupling the second output node to the first signal;
    a comparator, coupled to the first input capacitor and the second input capacitor, for comparing voltages at the first output node and the second output node to generate a comparing result; and
    a SAR controller, coupled to the comparator, for controlling the first capacitor array and the second capacitor array according to the comparing result.

2. The SAR ADC of claim 1, wherein the first default voltage is selected from a plurality of default voltages comprising the common voltage, and the second default voltage is selected from the plurality of default voltages comprising the common voltage.

3. The SAR ADC of claim 1, wherein the first signal is selected from a first input signal or the common voltage, the second signal is selected from a second input signal or the common voltage, and the first input signal and the second input signal are a differential input signal having the common voltage.

4. The SAR ADC of claim 3, wherein when the SAR ADC is operated under a sampling phase and a gain of the SAR ADC is greater than 1, the node of at least one first switched capacitor is connected to the first input signal, the node of at least one second switched capacitor is connected to the second input signal, the first common node and the second common node are connected to the common voltage, the first output node is connected to the second input signal, and the second output node is connected to the first input signal.

5. The SAR ADC of claim 4, wherein after the SAR ADC is operated under the sampling phase, the SAR ADC is operated under an amplifying phase, and when the SAR ADC is operated under the amplifying phase, the node of each of the first switched capacitors is connected to its corresponding first default voltage, the node of each of the second switched capacitors is connected to its corresponding second default voltage, the first common node and the second common node are not connected to the common voltage, the first output node is not connected to the second input signal, and the second output node is not connected to the first input signal.

6. The SAR ADC of claim 5, wherein the SAR controller controls the first capacitor array and the second capacitor array according to the comparing result only when the SAR ADC is operated under the amplifying phase.

7. The SAR ADC of claim 4, wherein the comparator is reset or turned off under the sampling phase.

8. The SAR ADC of claim 3, wherein when the SAR ADC is operated under a sampling phase and a gain of the SAR ADC is lesser than 1, the node of at least one first switched capacitor is connected to the first input signal, the node of at least one second switched capacitor is connected to the second input signal, the first common node and the second common node are connected to the common voltage, the first output node is connected to the common voltage, and the second output node is connected to the common voltage.

9. The SAR ADC of claim 8, wherein after the SAR ADC is operated under the sampling phase, the SAR ADC is operated under an amplifying phase, and when the SAR ADC is operated under the amplifying phase, the node of each of the first switched capacitors is connected to its corresponding first default voltage, the node of each of the second switched capacitors is connected to its corresponding second default voltage, the first common node and the second common node are not connected to the common voltage, the first output node is not connected to the second input signal, and the second output node is not connected to the first input signal.

10. The SAR ADC of claim 9, wherein the SAR controller controls the first capacitor array and the second capacitor array according to the comparing result only when the SAR ADC is operated under the amplifying phase.

11. The SAR ADC of claim 8, wherein the comparator is reset or turned off under the sampling phase.

* * * * *